United States Patent [19]
Duerr

[11] Patent Number: 5,294,886
[45] Date of Patent: Mar. 15, 1994

[54] ANTENNA SYSTEM FOR A MAGNETIC RESONANCE IMAGING TOMOGRAPHY APPARATUS

[75] Inventor: Wilhelm Duerr, Erlangen, Fed. Rep. of Germany

[73] Assignee: Siemens Aktiengesellschaft, Munich, Fed. Rep. of Germany

[21] Appl. No.: 872,100

[22] Filed: Apr. 22, 1992

[30] Foreign Application Priority Data

Apr. 22, 1991 [DE] Fed. Rep. of Germany ....... 4113120

[51] Int. Cl.⁵ ............................................. G01R 33/00
[52] U.S. Cl. ..................................... 324/318; 324/322
[58] Field of Search ............. 333/24 R, 181; 343/743; 324/300, 307, 309, 310, 311, 312, 313, 314, 318, 322

[56] References Cited

U.S. PATENT DOCUMENTS

| | | | |
|---|---|---|---|
| 4,680,550 | 7/1987 | Krause | 324/318 |
| 4,801,885 | 1/1989 | Meissner et al. | 324/318 |
| 4,922,204 | 5/1990 | Duerr et al. | 324/322 |
| 4,945,321 | 7/1990 | Oppelt et al. | 333/119 |
| 5,200,703 | 4/1993 | Popp et al. | 324/322 |

*Primary Examiner*—Michael J. Tokar
*Attorney, Agent, or Firm*—Hill, Steadman & Simpson

[57] ABSTRACT

In a magnetic resonance imaging tomography apparatus having a transmission antenna for exciting nuclear spins in an examination subject, and a reception antenna in the form of a local coil, the feeder for the local coil is provided with decoupling elements. The decoupling elements prevent a coupling of the electrical field of the transmission antenna with the feeder for the local coil.

9 Claims, 4 Drawing Sheets

ANTENNA SYSTEM FOR A MAGNETIC RESONANCE IMAGING TOMOGRAPHY APPARATUS

BACKGROUND OF THE INVENTION

1. Field of the Invention

The present invention is directed to a magnetic resonance imaging tomography devices, of the type having a transmission antenna for exciting nuclear spins in an examination subject and a reception antenna in the form of a local coil.

2. Description of the Prior Art

Magnetic resonance imaging devices are known for use in producing tomograms of an examination subject, such as a human body. Such magnetic resonance imaging devices include a basic or fundamental field magnet, which aligns the nuclear spins in the examination subject, and also contain gradient coils which generate respectively spatially different magnetic fields, as well as high-frequency antennas for exciting the nuclear spins and for receiving the signals emitted by the excited nuclear spins. If a high-frequency antenna is used which contains an excitation and measuring coil, the inductance of the coil together with a variable capacitance are combined as an LC resonant circuit. The capacitance is then varied to tune the resonant frequency of the circuit to the desired frequency.

A known embodiment of such a magnetic resonance imaging apparatus has a superconducting basic field magnet, in the form of a solenoid, which generates a basic field extending in the direction of the cylinder axis. The excitation coil of the antenna in this known system may, for example, be formed by conductors which extend parallel to the cylinder axis and are arranged in a so-called envelope pipe, which represents a high-frequency shield consisting of material having good electrical conductivity which is frequency-transmissive for the low-frequency gradient fields but is non-transmissive for the high-frequency antenna fields. The ends of these conductors are respectively connected to the envelope pipe via at least one resonant capacitor. A high-frequency equiphase field is formed between the conductor and the envelope pipe. The envelope pipe projects beyond the end faces of the conductors, so that a circular hollow waveguide antenna having aperiodic wave propagation is achieved, whose coupling elements are the conductors of the excitation coil of the antenna. Such a known arrangement is described in U.S. Pat. No. 4,680,550.

It is also known to make use of so-called surface coils or local coils for generating images of small body sections. A good signal-to-noise ratio is obtained with such local coils, because noise signals can only be received from a comparatively small body region. In the simplest case, such surface coils consist of a circular wire loop adapted for handling high-frequency signals. Since it is necessary that the excitation field which excites the nuclear spins be as homogenous as possible, and since a local coil could not achieve the desired homogeneity, a whole-body antenna is used as the excitation coil, for generating a high-frequency field having good field homogeneity. The local coil is then used solely for reception purposes. In this type of antenna system, therefore, two different, resonant high-frequency antennas participate in the imaging.

In order to avoid coupling of the high-frequency alternating fields, generated by the transmission antenna, with the reception antenna, the reception antenna can be detuned during transmission and the transmission antenna can be detuned during reception. Such detuning is achieved by DC-controlled high-frequency switches, preferably by a circuit having PIN diodes as disclosed in U.S. Pat. No. 4,801,885. Coupling via the high-frequency magnetic fields is thereby reduced. In addition, however, coupling of the electric field of the transmission antenna with the feeder for the local coil may also occur.

SUMMARY OF THE INVENTION

It is an object of the present invention to provide an antenna system for a magnetic resonance imaging tomography apparatus of the type having a local coil used as the reception antenna, wherein coupling of the feeder for the local coil with the high-frequency field of the transmission antenna is avoided.

The above object is achieved in an antenna system for a magnetic resonance imaging tomography apparatus constructed in accordance with the principles of the present invention wherein the feeder for the local coil is provided with one or more decoupling elements. A special cable guide, as has been conventionally used in an effort to minimize such coupling, is no longer required for the feeder to the reception antenna constructed in accordance with the principles of the present invention which contains such decoupling elements. The decoupling elements are preferably in the form of additional inductances. The power density inside the feeder is limited to comparatively low values during the transmission phase.

In a preferred embodiment, the decoupling elements are surface wave traps in the form of a toroid, of the type described in U.S. Pat. No. 4,922,204 for other purposes.

DESCRIPTION OF THE PREFERRED EMBODIMENTS

Figure 1:
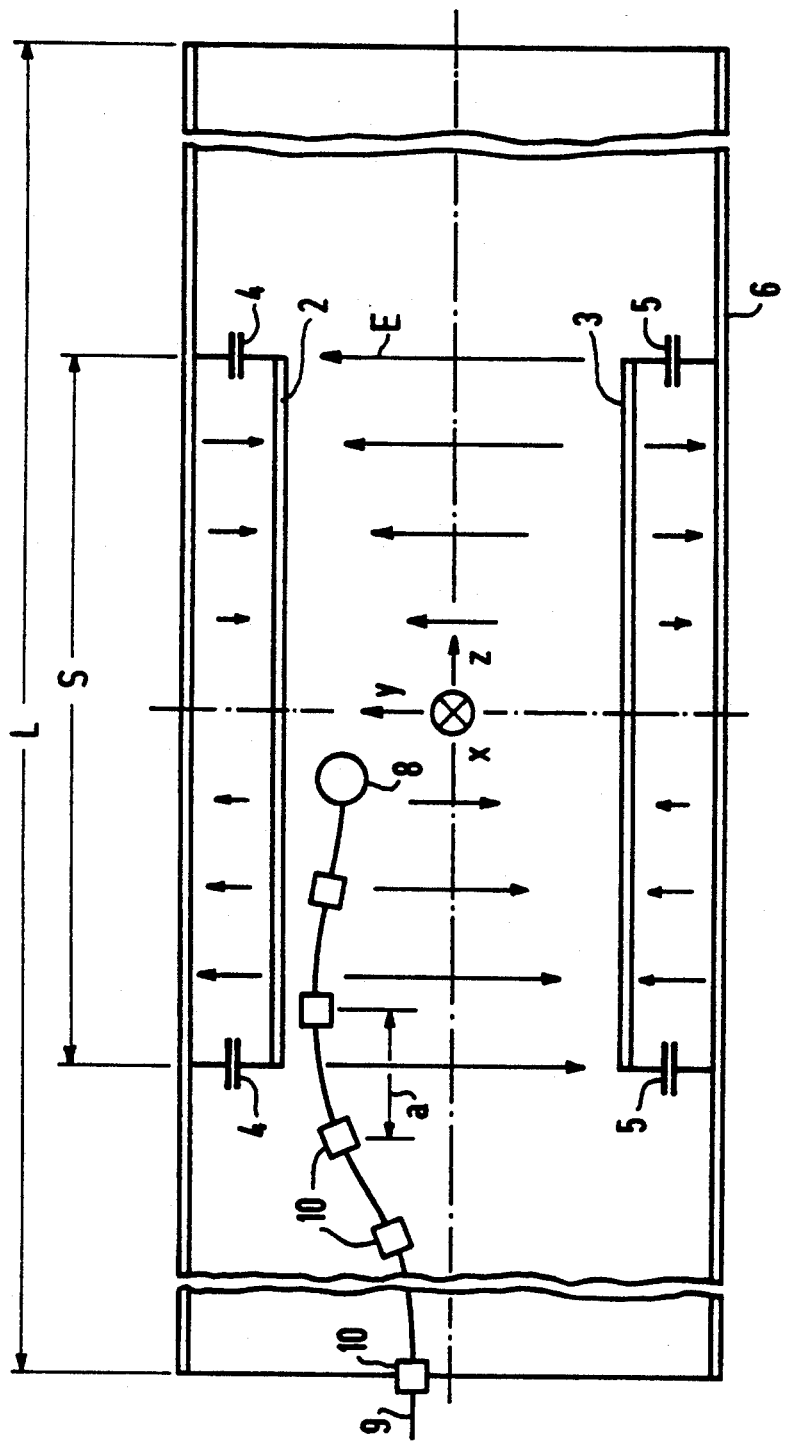
FIG. 1 is a side sectional view of a magnetic resonance imaging tomography apparatus embodying an antenna system constructed in accordance with the principles of the present invention.

A magnetic resonance imaging tomography apparatus embodying an antenna system constructed in accordance with the principles of the present invention is shown in FIG. 1. The tomography apparatus includes a hollow-cylindrical basic field magnet (not shown) and a circularly polarizing antenna provided as the excitation coil. In the embodiment shown in FIG. 1, the circularly polarizing antenna is formed by four antenna conductors, only two of which can be seen in FIG. 1, referenced 2 and 3. The antenna conductors are connected via resonance capacitors 4 and 5 to a hollow-cylindrical high-frequency shield 6, which is permeable for the low-frequency gradient fields and impermeable for high-frequency fields. The shield 6 consists of material having good electrical conductivity, for example copper foil, and is secured to a carrier (not shown). The antenna conductors 2 and 3 have a length S which is signicantly shorter than the length L of the high-frequency shield 6. The conductors 2 and 3 (as well as the other conductors which are not shown in FIG. 1) in combination with the high-frequency shield 6 form a circular hollow waveguide antenna having aperiodic wave propagation, whose coupling elements are the antenna conductors 2 and 3 (and the other antenna conductors). A local coil 8 having a feeder 9 is provided for measurement (i.e., receiving signals emitted by the excited spinning nuclei).

The electrical field of the antenna conductors 2 and 3 is indicated in FIG. 1 by arrows (not separately provided with reference numerals) whose length is intended to indicate the strength of the electrical field E at the location of the arrow. The basic field proceeds in the direction of the z-axis of a Cartesian coordinate system, with the z-axis itself representing the equipotential area or surface. There is also an equipotential area or surface in the plane z=0, indicated as a dot-dashed line in FIG. 1. The y=0 plane is also an equipotential area or surface in the case of this linearly polarizing antenna. When the feeder 9 for the local coil 8 is situated in the field E in a region outside the aforementioned equipotential areas, differences in potential will exist on the surface of the conductor forming the feeder 9, and the field penetrating into the conductor, due to forces acting on the free charge carriers. These differences in potential will generate a current flux, with an associated electromagnetic field which can locally heat the patient on whose body the feeder 9 is resting. For particular lengths of the feeder 9, in combination with its position in the high-frequency shield 6, resonances can be created and thus standing waves on the feeder 9 can arise. The currents induced on the shielding of the feeder 9 during transmission are then relatively high. This coupling can further cause a distortion of the field E of the antenna conductors 2 and 3, and thus can result in a corresponding disturbance in the image.

In accordance with the invention, therefore, a plurality of decoupling elements 10, preferably inductances, are provided in the feeder 9 to the local coil 8 at predetermined intervals a. The decoupling elements 10 have a high impedance, and thus divide the feeder 9 into individual conductor elements having a length a. These individual conductor elements are decoupled from each other. The interval a between the decoupling elements 10 will generally not substantially exceed 20 cm, and will preferably be approximately 10 cm.

A reception amplifier (not shown in FIG. 1) may also be arranged in series with the decoupling elements 10 at the input of the local coil 8.

Figure 2:
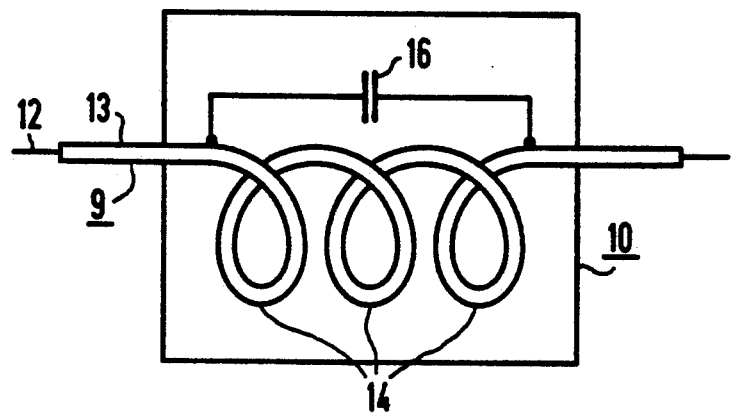
FIGS. 2, 3 and 4 respectively show different embodiments of decoupling elements for use in the antenna system of FIG. 1, constructed in accordance with the principles of the present invention.

In the embodiment shown in FIG. 2, a decoupling element 10 is formed by a coaxial conductor of the feeder 9, having an inner conductor 12 and a shielding or jacket 13 which is arranged with at least two, and preferably at least three, loops 14 having a high inductance. The loops 14 are bridged by a resonance capacitor 16. The resonance capacitor 16 increases the impedance of the decoupling element 10, and forms a parallel resonant circuit with the inductance of the loops 14. Given a magnetic resonance imaging apparatus operating at, for example, 40 MHz and if the inductance of the three loops 14 is, for example, 1 $\mu$H, the capacitance of the resonance capacitor 16 will be, for example, approximately 10 pF. The conductor loops 14 and the resonant capacitor 16, for example, can be cast in a housing (not shown in FIG. 2).

Figure 3:
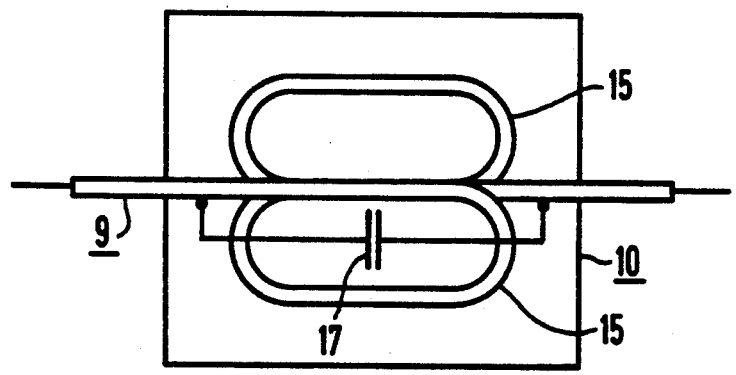

A further embodiment of a decoupling element 10 is shown in FIG. 3, formed by two or more conductor loops 15 in the form of a figure-eight. The conductor loops 15 are bridged by a resonance capacitor 17. This embodiment of the decoupling element 10 has the advantage that the conductor loops 15 are intrinsically decoupled from a uniform, high-frequency magnetic field.

Figure 4:
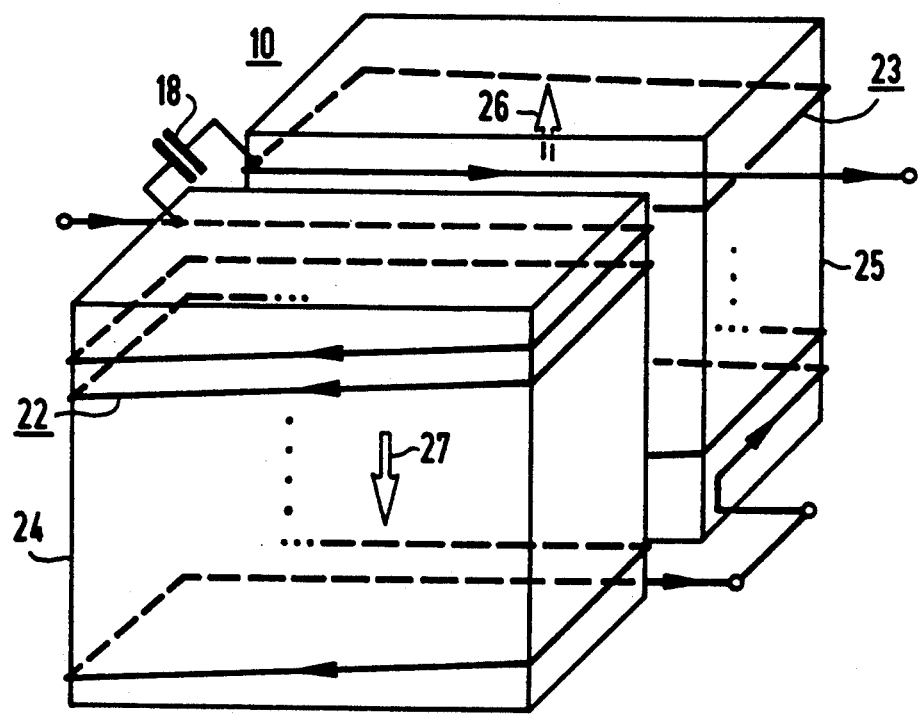

In the embodiment of a decoupling element 10 shown in FIG. 4, two separate cylinder coils 22 and 23, each having a plurality of turns (the individual turns not being shown in detail) are provided. The coils 22 and 23 can be wound on a common core, or, as shown in FIG. 4, are preferably arranged on separate cores 24 and 25. The cores 24 and 25 consist of non-magnetic material, for example plastic. The two coils 22 and 23 are wound in the form of a figure-eight, and are electrically connected so as to generate oppositely directed fields, as indicated by the arrows 26 and 27. The beginning of the cylinder coil 22 and the end of the cylinder coil 23 are bridged by a resonance capacitor 18.

A feeder was obtained with the following exemplary values, which, upon introduction of the local coil 8 into the imaging volume around the origin of the coordinate system shown in FIG. 1, resulted in substantially no coupling of the high-frequency fields in high-frequency shield 6. Therefore, neither a resonance shift nor a change in the reflection factor occurred. The exemplary feeder 9 had an overall length of 1 m, and the individual conductor segments between the decoupling elements 10 had a length a of 10 cm each and an outside diameter of the shielding 13 of 0.6 mm. A total of ten decoupling elements 10 were provided. Each decoupling element 10 was formed by two cylinder coils 22 and 23, each cylinder coil having twenty turns and an inductance L=2 $\mu$H. The resonance capacitor 18 had a value of C=6.2 pF. The decoupling elements 10 had an operating frequency and natural resonance of 40 MHz.

Figure 5:
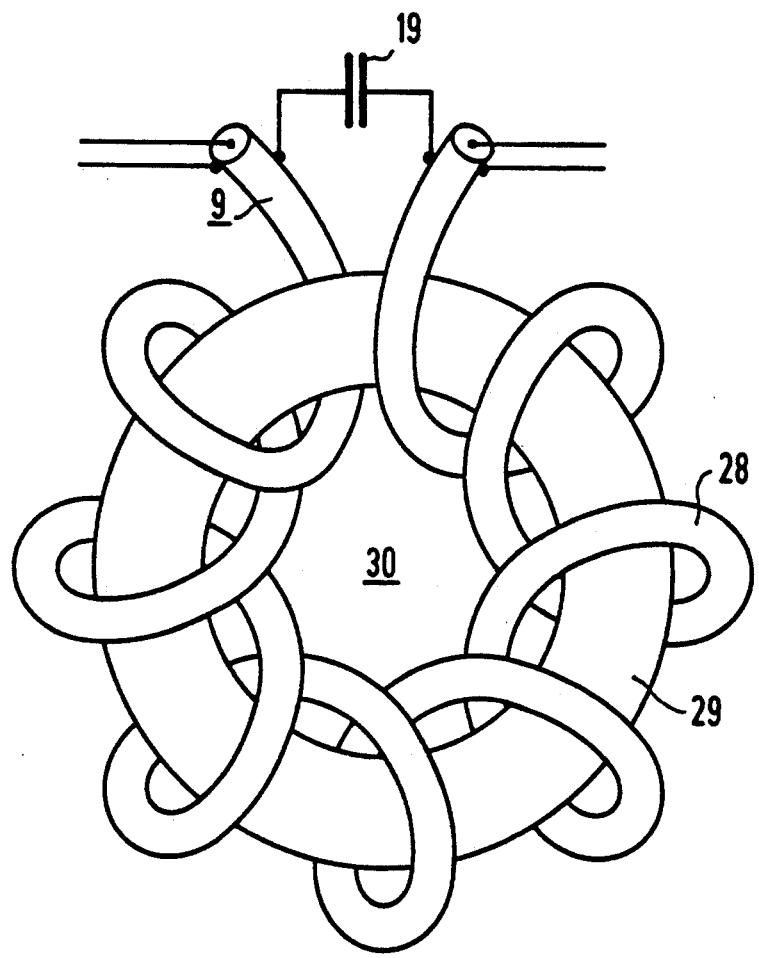
FIG. 5 shows a decoupling element for use in the antenna system of FIG. 1 in accordance with the principles of the present invention in the form of a toroidal surface wave trap.

In the embodiment of FIG. 5, a toroidal surface wave trap of the type described in the aforementioned U.S. Pat. No. 4,922,204 is provided as a decoupling element 10. The turns 28 of the feeder 9 are wound onto a core 29, and the start and the end of the feeder 9 (not separately referenced) are bridged by a resonant capacitor 19.

A magnetic resonance imaging tomography apparatus having a basic field proceeding in the direction of the z-axis, i.e., in axial direction of the hollow-cylindrical high-frequency shield 6, is shown in FIG. 1 as exemplary embodiment. The inventive concepts disclosed herein, however, can be used in other magnetic resonance tomography structures, for example those using a C-magnet or a H-magnet.

Although modifications and changes may be suggested by those skilled in the art, it is the intention of the inventor to embody within the patent warranted hereon all changes and modifications as reasonably and properly come within the scope of his contribution to the art.

We claim as our invention:

1. In a magnetic resonance imaging tomography apparatus having a transmission antenna for exciting nuclear spins in an examination subject and a reception antenna for receiving signals of excited nuclei in said examination subject in the form of a local coil, the improvement comprising:

a feeder for said local coil having a plurality of decoupling elements connected therein and disposed at predetermined intervals along a length of said feeder and dividing said feeder into a plurality of individual conductor elements which are decoupled from each other.

2. The improvement of claim 1 wherein said decoupling elements are inductances.

3. The improvement of claim 2 wherein said decoupling elements are formed by a plurality of conductor loops.

4. The improvement of claim 3 wherein said conductor loops are bridged by a resonance capacitor forming a parallel resonant circuit in combination with the inductances of said conductor loops.

5. The improvement of claim 1 wherein said decoupling elements are formed by two cylinder coils in the form a figure-eight.

6. The improvement of claim 5 wherein each cylinder coil has rectangular windings.

7. The improvement of claim 6 wherein said windings of said cylinder coils are wound on a core consisting of non-magnetic material having a substantially rectangular cross section.

8. The improvement of claim 1 wherein at least one toroidal surface wave trap is provided as a decoupling element.

9. The improvement of claim 1 further comprising a reception amplifier connected between said local coil and decoupling elements.

* * * * *